United States Patent [19]

Miyauchi et al.

[11] 4,283,785
[45] Aug. 11, 1981

[54] OPTICAL INFORMATION RECORDING APPARATUS

[75] Inventors: Toshimitsu Miyauchi, Hachioji; Yoshito Tsunoda, Mitaka, both of Japan

[73] Assignee: Hitachi, Ltd., Tokyo, Japan

[21] Appl. No.: 33,806

[22] Filed: Apr. 26, 1979

[30] Foreign Application Priority Data

Apr. 28, 1978 [JP] Japan .................................. 53-49831

[51] Int. Cl.³ .............................................. G11B 7/00
[52] U.S. Cl. .................................. 369/116; 369/106; 369/121
[58] Field of Search ............ 358/127, 128, 130, 128.5; 179/100.3 F, 100.3 GM, 100.3 N, 100.3 M, 100.3 V, 100.16; 346/108, 76 L

[56] References Cited

U.S. PATENT DOCUMENTS

| | | | |
|---|---|---|---|
| 3,654,624 | 4/1972 | Becker et al. | 346/76 L X |
| 4,051,329 | 9/1977 | Blondet et al. | 179/100.3 V X |
| 4,093,961 | 6/1978 | Kanamaru | 179/100.3 V X |

Primary Examiner—Bernard Konick
Assistant Examiner—Aristotelis M. Psitos
Attorney, Agent, or Firm—Craig and Antonelli

[57] ABSTRACT

In an optical information recording apparatus, a version of a recording light emitted from a light source and reflected by a recording medium is detected to control the recording light output power of the light source.

4 Claims, 24 Drawing Figures

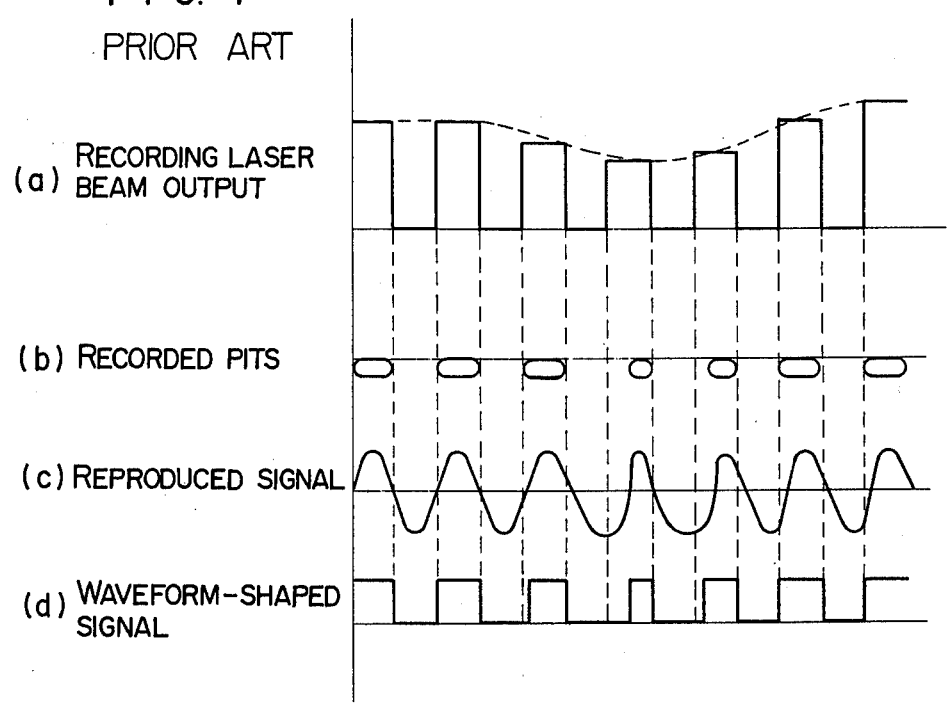
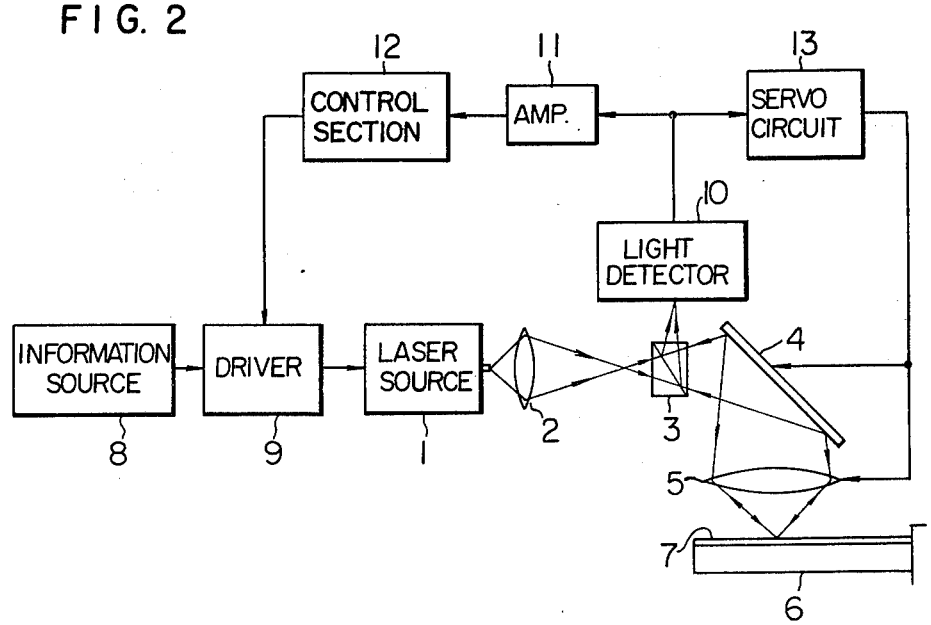

FIG. 5a
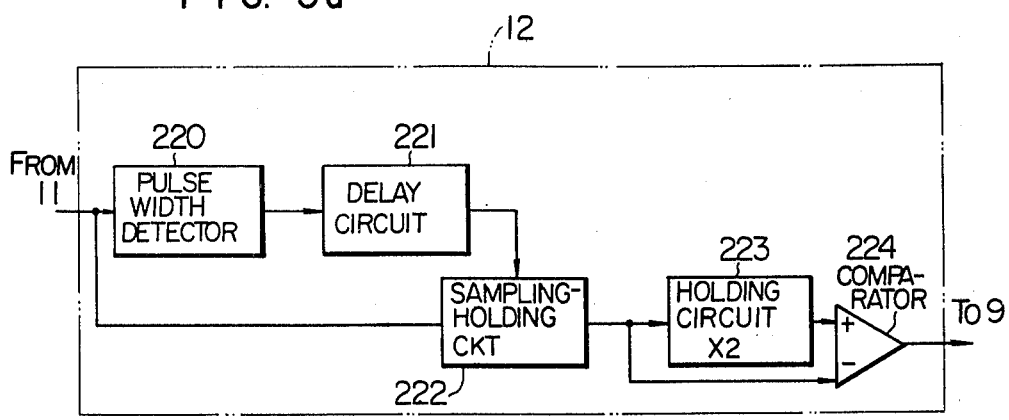
FIG. 5b INPUT FROM 11
FIG. 5c OUTPUT OF 220
FIG. 5d OUTPUT OF 221
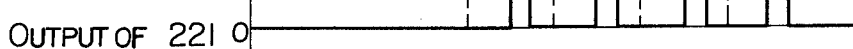
FIG. 5e OUTPUT OF 222
FIG. 5f OUTPUT OF 223
FIG. 5g OUTPUT OF 224
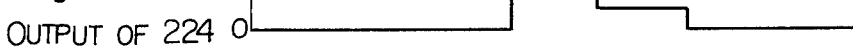

FIG. 6a
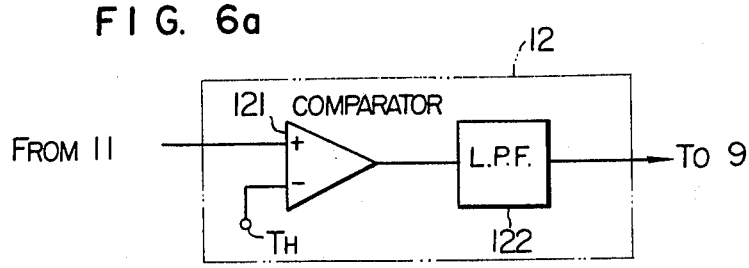
FIG. 6b
INPUT FROM 11
FIG. 6c
OUTPUT OF 121
FIG. 6d
OUTPUT OF 122
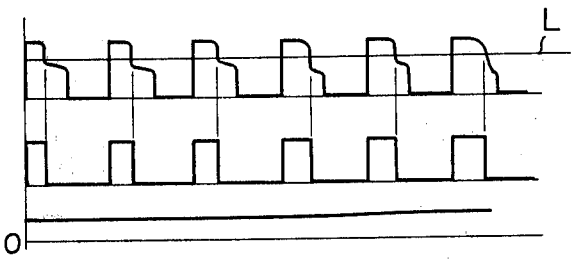
FIG. 7a
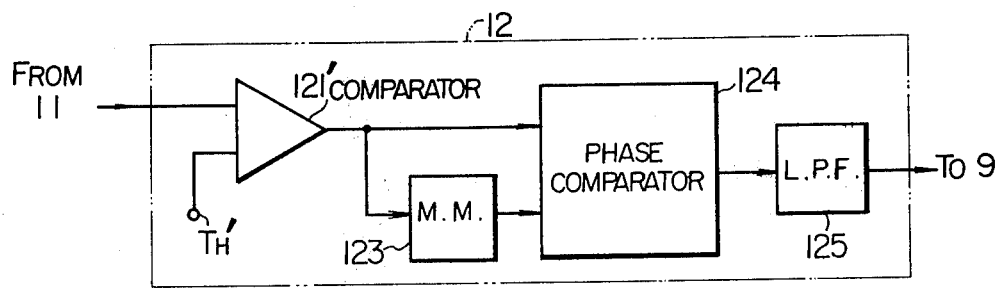
FIG. 7b
OUTPUT OF 121'
FIG. 7c
OUTPUT OF 123
FIG. 7d
OUTPUT OF 124
FIG. 7e
OUTPUT OF 125
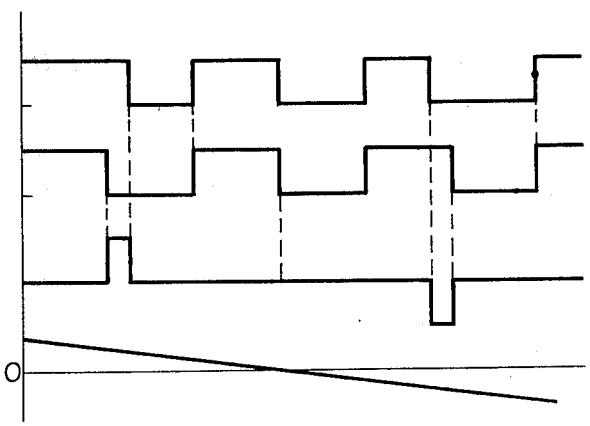

OPTICAL INFORMATION RECORDING APPARATUS

This invention relates to an optical information recording apparatus in which the output power of a light source is controllable.

This invention as well as the prior art will be described in conjunction with the accompanying drawings, in which:

FIG. 1 is a view including waveforms useful in explaining a problem which may be encountered in the conventional optical information recording apparatus;

FIG. 2 schematically shows an optical information recording apparatus according to an embodiment of this invention;

FIG. 5a shows a circuit diagram of one example of the control section used in this invention;

FIGS. 5b to 5g show waveforms appearing at various portions in the control section shown in FIG. 5a;

FIG. 6a shows a circuit diagram of another example of the control section used in this invention;

FIGS. 6b to 6d show waveforms appearing at various portions in the control section shown in FIG. 6a;

FIG. 7a shows a circuit diagram of still another example of the control section used in this invention; and FIGS. 7b to 7e show waveforms appearing at various portions in the control section shown in FIG. 7a.

Figure 3:
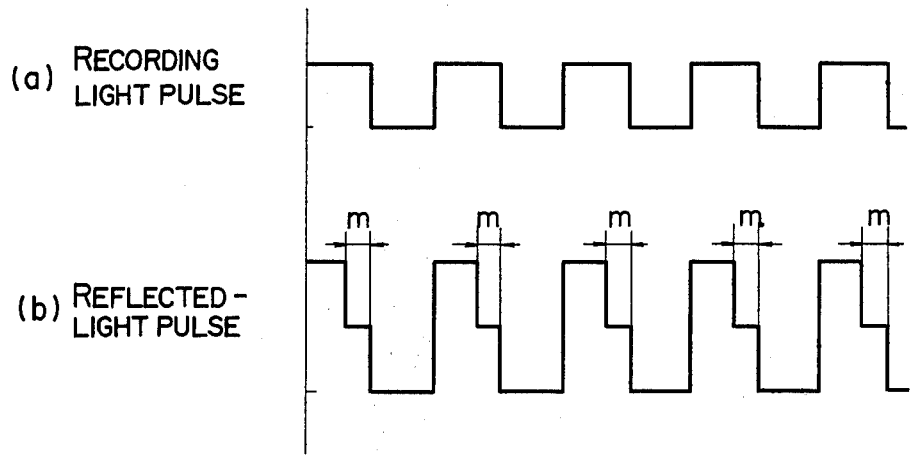
FIG. 3 shows waveforms recording information pulses and reflected-light pulses useful in explaining this invention.

A conventional optical information recording/reproducing apparatus such as an optical video disc or an optical data recorder using a laser as its light source and modulating a laser beam from the laser source with a pulsated signal from an information source to record desired information in ON-OFF bit form on the recording medium of a disc, has encountered problems that when an output power from the laser source fluctuates with time or when a laser output power applied to a part of the disc near its periphery is the same as that applied to a part of the disc near its center (i.e. unless those laser output powers are controllably changed), the duty cycle of a reproduced signal obtained from the information recorded on the disc becomes different from the duty cycle of the used recording information signal so that beats appear on a display screen in the case of the optical video disc and data is erroneously read in the case of the optical data recorder.

The above-mentioned problem will be further explained with the aid of FIG. 1. If the recording laser beam output power from a laser source fluctuates as shown in (a) of FIG. 1, pits formed by the recording laser beam in the recording medium of a disc would have shapes as shown in (b) of FIG. 1. A reproduced signal obtained by the irradiation of these pits with a laser beam is accordingly as shown in (c) of FIG. 1. Namely, the duty cycle of the reproduced signal (c) fluctuates in correspondence with the fluctuation of the recording laser beam power (a). A waveform-shaped version of the reproduced signal after being passed through a limiter is shown in (d) of FIG. 1. If information is demodulated or reproduced from such a signal as shown in (c) of FIG. 1, reflection noises due to secondary distortions appear on a display screen in the case of an optical video disc to degrade the reproduced information and the synchronization between the reproduced signal and a reading clock signal is difficult in the case of an optical data recorder, resulting in erroneous reading.

The same problem results from effects depending on the radial distance from the center of the disc. Namely, since the disc is rotating at a constant speed, the irradiated laser energy per unit area on the disc is inversely proportional to the radial distance from the disc center if the laser beam output power is kept constant. This causes the same results as the case of the above-described fluctuation of the laser beam output power. For example, the irradiated energy $E_1$ per unit area for a radial distance of 150 mm is equal to a half of the irradiated energy $E_2$ per unit area for a radial distance of 75 mm, that is, $E_2 = 2E_1$.

An object of this invention is to provide an optical information recording apparatus in which a reproduced signal having the substantially same duty cycle as a recording information signal can be obtained by controlling at the time of an information recording process a recording light output power of a light source by means of a reflected version of the recording signal from a recording medium.

According to this invention, there is provided an optical information recording apparatus comprising a light source and a recording medium on which predetermined information is recorded by the irradiation of a recording light emitted from said light source and modulated by said predetermined information, characterized by further comprising detecting means for detecting a reflected version of said recording light from said recording medium, and a control section for controlling the recording light output power of said light source in response to the output of said detecting means.

FIG. 2 shows an optical information recording apparatus as an embodiment of this invention, in which a semiconductor laser is used as a light source. The light emitted from a semiconductor laser source 1 is passed through a lens 2, a prism 3 and a galvanomirror 4 and is then focussed by a focussing lens 5 to a spot having a diameter of 1-2 μm on a recording medium 7 of a disc 6. The recording medium 7 is reflective and may be a thin deposited film which has a thickness of about 100-1000 Å and is made of one of metals including Bi, Au, Al, etc. or an alloy thereof or made of a calcogen glass material such as As, Te, Ge, Se, etc. or an alloy thereof.

Pulse information from an information source 8 is supplied through a laser driver 9 to the laser source 1 which in turn emits recording light pulses modulated in accordance with the pulse information. The recording light pulse if focused by the lens 5 to a light spot on the recording medium 7. Assuming that the recording light pulse takes a high or low (zero) power level in accordance with "1" or "0" of the information pulse, the light spot available from the high power level recording light pulse fuses the recording medium to form a pit therein while the light spot available from the low power level recording light pulse forms no pit in the recording medium 7. A reflected version of the recording light pulse from the recording medium 7 is directed through the prism 3 to a light detector 10. As disclosed by, for example, U.S. Pat. Nos. 4,059,841 and 4,051,527, the light detector 10 may be combined with a cylindrical lens (not shown) and may be quartered into four segmental light-receiving regions. With such a combination of the cylindrical lens and the quartered light detector, a video signal, an automatic focus signal and a tracking signal can be detected, as shown in the above U.S. Patents.

It has been found that the recording light pulses and the reflected-light pulses are as shown in (a) and (b) of FIG. 3 respectively. From (b) of FIG. 3, it is seen that the reflectivity of the recording medium is variable during the period of irradiation of the recording light pulse, i.e., the level of the reflected-light pulse from the recording medium lowers, after a certain time interval from the application instant of the high level recording light pulse, due to the formation of a pit resulting from the fusion of the recording medium. In FIG. 3, m represents the magnitude of such a change in pulse width of the reflected-light pulse.

Figure 4:
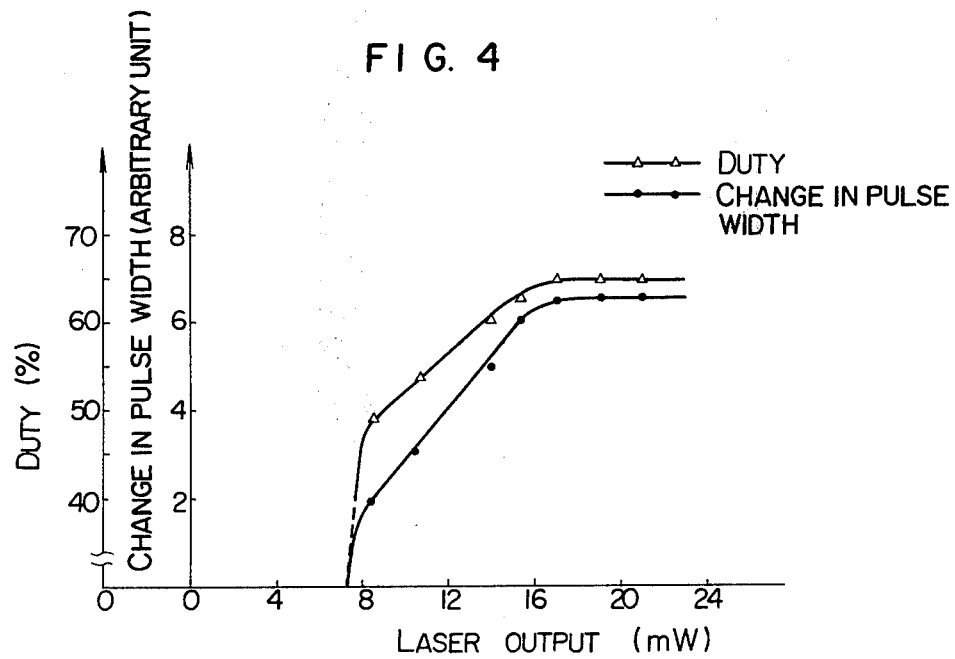
FIG. 4 shows in graphical representation the relationship between laser output and duty as well as change in reflected-light pulse width obtained from the present inventors' experiments.

FIG. 4 shows the change in pulse width of the reflected-light pulse when the recording light energy (laser output) is changed, as the results of the present inventors' experiments. FIG. 4 also shows the change in duty cycle of a reproduced signal which was obtained in the same experiments. These results have been obtained under the conditions in which the duty cycle of the used recording light pulse signal was 50%, a CPS laser was used as the semiconductor laser source and calcogen glass material was used as the recording medium. The following facts (1) and (2) are seen from FIG. 4. (1) No change in duty cycle of the reproduced signal is observed above the value of laser output twice as large as a recording-start level at which the recording of information is effected. (2) There exists a certain laser output power region in which the duty cycle of the reproduced signal is directly proportional to the change in pulse width of the reflected-light pulse resulting from the fusion of the recording medium.

FIG. 5a shows one example of a control section 12 (see FIG. 2) used in this invention, designed in view of the above experimental fact (1) in order to reduce the change in duty cycle of the reproduced signal resulting from the change of recording light output power. The control circuit 12 shown in FIG. 5a is designed to detect the level of a laser output when the change in pulse width of the reflected-light is initiated (or a recording-start level) and to provide a feedback by which the driver 9 controls the laser source 1 to provide therefrom an output power twice as large as the recording-start level. Referring to FIG. 2, the reflected light from the disc is detected by a video amplifier 11 whose output is sent to the control section 12. Now referring to FIG. 5a, the control section 12 comprises a pulse width detector 220 which detects the change in pulse width of the reflected-light pulse (see FIG. 5b) supplied from the amplifier 11. The reflected-light pulse of FIG. 5b are ones when the laser output is gradually increased to establish a proper level thereof. As shown in FIG. 5b, the width of the reflected-light pulse changes or becomes small at the time when the laser output power reaches its recording-start level. Then, the pulse width detector 220 produces output pulses (see FIG. 5c) in accordance with the change in pulse width of the reflected-light pulses or corresponding to the magnitude of decrease of the pulse width. The successive output pulses from the detector 220 are supplied to a delay circuit 221 which in turn generates pulses delayed from the trailing edges of the respective output pulses of the detector 220 by T (see FIG. 5d). T is preselected such that the timing of generation of output pulses from the delay circuit 221 coincides with the leading edges of the successive reflected-light pulses. In other words, the magnitude of T is selected to be a pulse separation between the reflected-light pulses. The pulse heights of the reflected-light pulses (FIG. 5b) are sampled by a sampling-holding circuit 222 (hereinafter sampling circuit 222) in timing with the output pulses from the delay circuit 221 so that the sampling circuit 222 produces an output signal as shown in FIG. 5e. The start of recording is effected when an output pulse is first produced by the detector 220. Assume that the pulse height of the reflected-light pulse at that time is $P_O$. A value $2P_O$ twice as large as the first occurring output $P_O$ of the sampling circuit 222 is held in a holding circuit or a multiplier 223 (see FIG. 5f). The output of the holding circuit 223 is differentially compared in a comparator 224 with the pulse height of the reflected-light pulse sampled through the sampling circuit 222. The output (see FIG. 5g) of the comparator is supplied to the laser driver 9 shown in FIG. 2, thereby controlling the recording output power of the laser source 1. Namely, a feedback is so applied to the driver 9 that the output of the comparator may be zero. In other words, the circuit arrangement shown in FIG. 5a prevents the change in duty cycle of a reproduced signal by providing a laser output power equal to or greater than twice its recording-start level.

FIG. 6a shows another example of the control section 12 shown in FIG. 2. In this example, the control section 12 designed in view of th experimental fact (2) mentioned above with reference to FIG. 4, detects the change in pulse width of the reflected-light signal resulting from the fusion of the recording medium by the laser beam so that the recording-start timing is kept constant and hence the duty cycle of a reproduced signal becomes equal to that of a recording light pulse signal.

Referring to FIG. 6a, the reflected-light signal (see FIG. 6b) supplied from the video amplifier 11 is received by one input of a comparator 121 for waveform-shaping. For this purpose, a reference voltage is applied from a terminal $T_H$ to the other input of the comparator 121 and the magnitude L of the reference voltage is experimentally selected such that the duty cycle of a reproduced signal becomes equal to that of the corresponding recording information signal. The waveform-shaped pulses (see FIG. 6c) from the comparator 121 are averaged by a low-pass filter 122 (see FIG. 6d) whose output is fed back to the laser driver 9 shown in FIG. 2 to control the recording output power of the laser source 1.

FIG. 7a shows still another example of the control section 12 shown in FIG. 2. Similarly to the example shown in FIG. 6a, the output of the video amplifier 11 is applied to one input of a comparator 121' whose other input is applied with a reference voltage from a terminal $T'_H$. Waveform-shaped output pulses (see FIG. 7b) of the comparator 121' are applied to a monostable multivibrator 123 to generate reference pulses having a constant pulse width (see FIG. 7c). The width of the reference pulse is selected such that it may equal the width of the reflected-light pulse corresponding to the laser output power when the duty cycle of the recording light signal becomes equal to that of the reproduced signal. The waveform-shaped pulses from the comparator 121' and the reference pulses from the monostable multivibrator 123 are sent to a phase comparator 124 which in turn determines the phase difference between both the pulses to deliver a phase lag output or phase lead output (see FIG. 7d). The output of the phase comparator 124 is applied to a low-pass filter 125 in which the phase lag or lead is converted into a D.C. wise change. The output (see FIG. 7e) of the low-pass filter 125 is fed back to the laser driver 9 shown in FIG. 2, thereby controlling the recording output power of the laser source 1.

This invention can not only compensate for the fluctuation of the recording light output power due to the variation of the ambient temperature but also perform the control of the laser output power in correspondence with the radial distance from the center of a disc, so that a signal free from the change of duty cycle can be reproduced.

Again referring to FIG. 2, an automatic focussing at the time of an information recording process is performed in such a manner that an automatic focus signal is detected by the light detector 10 and applied to a servo circuit 13 which in turn controls the focussing lens 5 in a well-known manner. The galvanomirror 4 is fixed. At the time of an information reproducing process, the laser output power is reduced to one tenth of that at the time of the information recording process. The reproduction is performed with the galvanomirror 4 and the focussing lens 5 controlled by the servo circuit 13. Thus, the functions of recording and reproducing can be performed by the single optical system.

Though the foregoing description has been made exclusively to the case where a semiconductor laser is used as the light source, it is noted that the same result can be obtained by using a gas laser (He-Ne laser, Ar laser, etc.) instead of the semi-conductorlaser.

What is claimed is:

1. An optical information recording apparatus comprising:
    (a) a light source;
    (b) a recording medium on which predetermined pulse information is successively recorded through the irradiation of recording light pulses emitted from said light source and modulated in accordance with said predetermined pulse information, the reflectivity of said recording medium being variable during the period of irradiation of the recording light pulse so that a reflected version of the recording light pulse from said recording medium has a changing pulse width; and
    (c) a control circuit section including a pulse width change detecting circuit means for receiving the reflected-light pulse from said recording medium and detecting the change in pulse width of the reflected-light pulse to produce an output relating to that change and a control circuit means associated with said light source for controlling an output power therefrom on the basis of the output of said pulse width change detecting circuit means so that the pulse width of the reflected-light pulse from said recording medium is kept constant.

2. An optical information recording apparatus according to claim 1, wherein said control circuit means includes means for detecting the start of recording on said recording medium on the basis of the output from said pulse width change detecting circuit means, holding means for holding a value equal to or greater than twice as large as a pulse height of one of the reflected-light pulses from said recording medium at the time of start of recording, and comparator means for differentially comparing an output of said holding means with the respective pulse height of the reflected-light pulses from said recording medium, an output of said comparator means being fed to said light source to control the output power therefrom.

3. An optical information recording apparatus according to claim 1, wherein said control circuit means includes averaging means for averaging the output from said pulse width change detecting circuit means, an output of said averaging means being fed to said light source to control the output power therefrom.

4. An optical information recording apparatus according to claim 1, wherein said control circuit means includes reference pulse generator means for delivering a pulse signal output having a constant pulse width, comparator means for phase-comparing the output from said pulse width change detecting circuit means with the output from said reference pulse generator means, and averaging means for averaging an output of said comparator means, an output of said averaging means being fed to said light source to control the output power therefrom.

* * * * *